US012770834B2

(12) United States Patent
Lu et al.

(10) Patent No.: US 12,770,834 B2
(45) Date of Patent: Oct. 20, 2026

(54) PLASMA ENHANCED EPITAXIAL CHEMICAL VAPOR DEPOSITION SYSTEM

(71) Applicant: ASM IP Holding B.V., Almere (NL)

(72) Inventors: Yanfu Lu, Phoenix, AZ (US); Alexandros Demos, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 278 days.

(21) Appl. No.: 18/620,464

(22) Filed: Mar. 28, 2024

(65) Prior Publication Data

US 2024/0331984 A1 Oct. 3, 2024

Related U.S. Application Data

(60) Provisional application No. 63/456,044, filed on Mar. 31, 2023.

(51) Int. Cl.

| | |
|---|---|
| ***H01L 21/02*** | (2006.01) |
| ***C23C 16/24*** | (2006.01) |
| ***C23C 16/46*** | (2006.01) |
| ***H01J 37/32*** | (2006.01) |
| ***H10P 14/20*** | (2026.01) |
| ***H10P 14/24*** | (2026.01) |

(52) U.S. Cl.

CPC ........ *H01J 37/32522* (2013.01); *C23C 16/24* (2013.01); *C23C 16/46* (2013.01); *H01J 37/32357* (2013.01); *H10P 14/24* (2026.01); *H10P 14/3411* (2026.01); *H01J 2237/3321* (2013.01)

(58) Field of Classification Search

CPC ..... H01J 37/32522; C23C 16/24; C23C 16/46

See application file for complete search history.

(56) References Cited

U.S. PATENT DOCUMENTS

| | | | | | |
|---|---|---|---|---|---|
| 4,668,365 | A | | 5/1987 | Foster | |
| 4,974,543 | A | | 12/1990 | Jansen | |
| 5,472,508 | A | | 12/1995 | Saxena | |
| 7,253,084 | B2 | | 8/2007 | Todd | |
| 2010/0279020 | A1 | * | 11/2010 | Melnik | C23C 16/4488 427/419.7 |
| 2011/0244617 | A1 | * | 10/2011 | Su | H10H 20/01335 438/46 |
| 2012/0227667 | A1 | * | 9/2012 | Huang | C30B 25/12 427/256 |
| 2013/0285065 | A1 | * | 10/2013 | Zhu | H10H 20/815 204/192.25 |
| 2014/0141614 | A1 | * | 5/2014 | Chen | C04B 35/10 315/111.41 |

(Continued)

*Primary Examiner* — Thao P Le

(74) *Attorney, Agent, or Firm* — Banner & Witcoff, Ltd.

(57) ABSTRACT

Methods and apparatuses for a material layer deposition method in a semiconductor manufacturing system. A controller may seat a substrate on a substrate support. A silicon-containing material layer precursor may be provided to a remote plasma unit, which may decompose at least a portion of the silicon-containing material layer precursor. An epitaxial material layer comprising silicon may be deposited onto the substrate using a decomposition product. The deposition rate and/or growth rate may be increased at a given deposition temperature.

20 Claims, 8 Drawing Sheets

(56) References Cited

U.S. PATENT DOCUMENTS

| | | | | |
|---|---|---|---|---|
| 2014/0264363 A1* | 9/2014 | Zhu | .................... | H10D 62/8503 438/93 |
| 2020/0173022 A1* | 6/2020 | Han | .................. | C23C 16/45565 |
| 2022/0298636 A1* | 9/2022 | Asrani | .............. | C23C 16/45523 |
| 2026/0062803 A1* | 3/2026 | Gao | .................. | C23C 16/45514 |

* cited by examiner

PLASMA ENHANCED EPITAXIAL CHEMICAL VAPOR DEPOSITION SYSTEM

CROSS-REFERENCE TO RELATED APPLICATION(S)

This application claims the benefit of U.S. Provisional Application 63/456,044 filed on Mar. 31, 2023, the entire contents of which are incorporated herein by reference.

TECHNICAL FIELD

The present disclosure generally relates to vacuum deposition methods and systems. More particularly, the disclosure relates to using chemical vapor deposition in the semiconductor manufacturing process.

BACKGROUND

In plasma enhanced chemical vapor deposition, an epitaxial film (e.g., a material layer) is deposited from a gas state to a solid state onto a substrate, such as a silicon wafer. After a creation of a plasma of reacting gases, chemical reactions may occur in the reaction chamber, where one or more volatile precursors may react or decompose on the substrate surface to produce the material layer. To facilitate the occurrence of the chemical reactions, conventional systems may attempt to either increase the temperature at which the deposition occurs. However, such approaches may require large energy consumption or exceed the thermal budget of certain semiconductor devices that may be formed using the layer deposited onto the substrate, and cause undesirable side effects such as instability and chamber coating. As a result, conventional systems may lack a mechanism to strike a balance between growth rate and thermal consumption, and thereby limit its ability to control precursor deposition and provide optimal performance, throughput and energy consumption in the semiconductor manufacturing process.

SUMMARY

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

One or more aspects are described for a plasma enhanced epitaxial chemical vapor system. In one aspect, a semiconductor processing system may include one or more of the following: a chamber body formed from a quartz material; and a substrate support arranged within an interior of the chamber body and supported for rotation about a rotation axis within the interior of the chamber body, the substrate support formed from a bulk graphite material with a silicon carbide coating. The system may further include a heater element array supported outside of the chamber body, and optically coupled to the substrate support by the quartz material; and a remote plasma unit with a precursor inlet coupled to the chamber body, and configured to decompose a silicon-containing material layer precursor provided to the remote plasma unit. During deposition, an epitaxial material layer comprising silicon may be deposited onto the substrate, using a decomposition product generated from the silicon-containing material layer precursor.

In another aspect, the semiconductor processing system may include a precursor source comprising the silicon-containing material layer precursor connected to the precursor inlet of the remote plasma unit and therethrough to the chamber body. The silicon-containing material layer precursor may comprise a high-order silicon-containing material layer precursor. The high-order silicon-containing material layer precursor may include a non-halogenated high-order silicon-containing material layer precursor and a halogenated high-order silicon-containing material layer precursor. For example, the silicon-containing material layer precursor may include silane ($SiH_4$) and one or more of monochlorosilane, dichlorosilane, and trichlorosilane.

In another aspect, the semiconductor processing system may include a vacuum pump coupled to the chamber body and therethrough to the remote plasma unit. The chamber body may have an injection end and a longitudinally opposite exhaust end. The chamber body may further include an injection flange connected to the injection end of the chamber body and coupling the remote plasma unit to the chamber body, and an exhaust flange connected to the longitudinally opposite exhaust end of the chamber body and fluidly coupled to the remote plasma unit by the interior of the chamber body and the injection flange. The chamber may have a plurality of external ribs extending laterally about an exterior of the chamber body and longitudinally spaced apart from one another between the injection end and the longitudinally opposite exhaust end of the chamber body. The heater element array may include a plurality of lower linear lamps supported below the chamber body and optically coupled to the substrate support by the quartz material forming the chamber body. The heater element array may include a plurality of upper linear lamps supported above the chamber body and optically coupled to the substrate support by the quartz material forming the chamber body. The remote plasma unit may include an inductively coupled plasma source or a microwave plasma source. The remote plasma unit may include a precursor conduit connected to the precursor inlet; a coil extending about the precursor conduit; and a voltage source electrically connected to the coil and configured to flow a decomposition current through the coil. The coil may be spaced apart from the chamber body, for example to prevent the remote plasma unit from disrupting the heater element array in the chamber body, and to ensure that the plasma enters the chamber body through the injection flange.

In another aspect, the semiconductor processing system may further comprise a controller including a processor and memory having instructions recorded on the memory that, when read by the processor, cause the processor to: seat the substrate on the substrate support; provide the silicon-containing material layer precursor to the remote plasma unit; decompose at least a portion of the silicon-containing material layer precursor using the remote plasma unit; and deposit the epitaxial material layer comprising the silicon onto the substrate using the decomposition product generated from the silicon-containing material layer precursor. In some examples, heating of the substrate during deposition of the silicon-containing material layer precursor by the heater element array may be limited by the decomposition product generated from the silicon-containing material layer precursor, which may limit heating of the substrate seated on the substrate support by the heater element array. The instructions may further cause the remote plasma unit to decompose at least the portion of the silicon-containing material layer precursor provided to the remote plasma unit. For example, the instructions may cause the remote plasma unit to decompose between about 0.001% and about 90% of the silicon-containing material layer precursor provided to the remote plasma unit. Decomposing at least the portion of the silicon-containing material layer precursor may increase deposition rate or growth rate at a given deposition temperature, due to the fact that the decomposition product is more active and more likely to participate in the chemical reaction in the deposition process.

In another aspect, a material layer deposition method may be carried out by a semiconductor processing system. The semiconductor processing system may include a chamber body formed from a quartz material, a substrate support formed from a bulk graphite material with a silicon carbide coating arranged within an interior of the chamber body and supported for rotation about a rotation axis within the interior of the chamber body, a heater element array supported outside of the chamber body and optically coupled to the substrate support by the quartz material of the chamber body, and a remote plasma unit coupled to the chamber body. The material layer deposition method may include seating a substrate on the substrate support; providing a silicon-containing material layer precursor to the remote plasma unit; decomposing at least a portion of the silicon-containing material layer precursor using the remote plasma unit; and depositing an epitaxial material layer comprising silicon onto the substrate using a decomposition product generated from the silicon-containing material layer precursor.

In another aspect, depositing the epitaxial material layer may include heating of the substrate during deposition of the silicon-containing material layer precursor by the heater element array, which may be limited by the decomposition product generated from the silicon-containing material layer precursor. Seating the substrate on the substrate support may comprise seating one and only one substrate within the chamber body, and decomposing at least a portion of silicon-containing material layer precursor may comprise decomposing between about 0.001% and about 90% of the silicon-containing material layer precursor provided to the remote plasma source, and depositing the epitaxial material layer may comprise rotating the substrate about the rotation axis and flowing the decomposition product longitudinally through the chamber body and across the substrate. Seating the substrate on the substrate support may comprise seating more than one substrate within the chamber body.

In a further aspect, the silicon-containing material layer precursor may have a characteristic growth rate versus temperature curve (e.g., an Arrhenius curve). The material layer deposition method may further include heating the substrate to a predetermined material layer deposition temperature using the heater element array; and depositing the epitaxial material layer at a growth rate that is greater than a characteristic growth rate associated with the predetermined material layer deposition temperature on the characteristic growth rate versus temperature curve. The substrate may have a thermal budget, and the predetermined material layer deposition temperature may be less than the thermal budget of the substrate. The growth rate may be associated with a deposition temperature greater than the thermal budget on the characteristic growth rate versus temperature curve.

Additional aspects, configurations, embodiments, and examples are described in more detail below.

BRIEF DESCRIPTION OF DRAWINGS

Some features are shown by way of example, and not by limitation, in the accompanying drawings In the drawings, like numerals reference similar elements.

Figure 1:
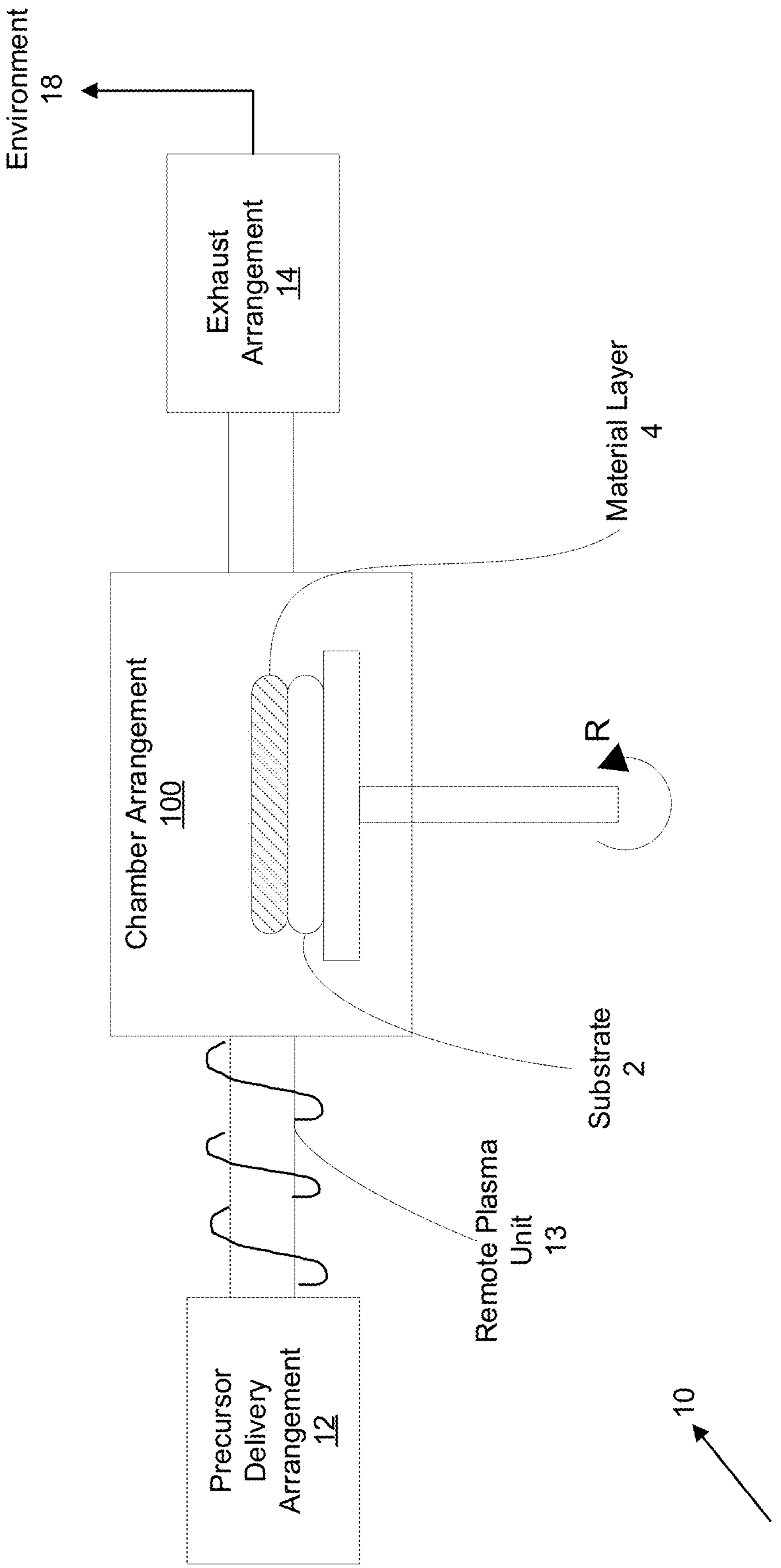
FIG. 1 is a schematic view of a semiconductor processing system including a remote plasma unit in accordance with the present disclosure, showing a precursor delivery arrangement connected to a chamber arrangement via the remote plasma unit.

It will be recognized by the skilled person in the art, given the benefit of this disclosure, that the exact arrangement, sizes and positioning of the components in the figures is not necessarily to scale or required.

DETAILED DESCRIPTION

One or more aspects of the disclosure relate to a material layer deposition method and a semiconductor processing system such as a plasma enhanced epitaxial chemical vapor system. The semiconductor processing systems may be used to process substrates, such as semiconductor wafers. By way of examples, the systems described herein can be used to form or grow epitaxial layers (e.g., two component and/or doped semiconductor layers) on a surface of a substrate. Exemplary systems can be further used to provide etch chemistry to a substrate surface. For example, exemplary systems can provide a mixture of two or more gases (e.g., collectively referred to herein as a mixture or simply gas or first gas) during a deposition (e.g., growth) process and/or two or more gases (e.g., collectively referred to herein as a mixture or simply gas or second gas) during an etch process. Both the deposition and etch gases can be used to grow an epitaxial film on a substrate.

As used herein, the term "substrate" may refer to any underlying material or materials upon which a layer may be deposited. A substrate may include a bulk material, such as silicon (e.g., single-crystal silicon) or other semiconductor material, and may include one or more layers, such as native oxides or other layers, overlying or underlying the bulk material. Further, the substrate may include various topologies, such as recesses, lines, and the like formed within or on at least a portion of a layer and/or bulk material of the substrate. By way of particular examples, a substrate may comprise one or more materials including, but not limited to, silicon (Si), germanium (Ge), germanium tin (GeSn), silicon germanium (SiGe), silicon germanium tin (SiGeSn), silicon carbide (SiC), or a group III-V semiconductor material, such as, for example, gallium arsenide (GaAs), gallium phosphide (GaP), or gallium nitride (GaN). In some aspects, the substrate may comprise one or more dielectric materials including, but not limited to, oxides, nitrides, or oxynitrides.

For example, the substrate may comprise a silicon oxide (e.g., $SiO_2$), a metal oxide (e.g., $Al_2O_3$), a silicon nitride (e.g., $Si_3N_4$), or a silicon oxynitride. In some embodiments of the disclosure, the substrate may comprise an engineered substrate wherein a surface semiconductor layer is disposed over a bulk support with an intervening buried oxide (BOX) disposed therebetween. The substrate may contain one or more monocrystalline surfaces and/or one or more other surfaces that may comprise a non-monocrystalline surface, such as a polycrystalline surface and/or an amorphous surface. The substrate may include a layer comprising a metal, such as copper, cobalt, and the like.

The terms precursor gas and/or precursor gasses may refer to a gas or combination of gasses that participate in a chemical reaction that produces another compound. For example, precursor gasses may be used to grow an epitaxial layer comprising silicon germanium. Precursor gasses may include a deposition gas or gasses, a dopant gas or gasses, or a combination of a deposition gas or gasses and a dopant gas or gasses. The precursor gases may include a silicon-containing material layer precursor such as a high-order silicon-containing material layer precursor. The silicon-containing material layer precursor may further include silane ($SiH_4$) or chlorosilane ($SiCl_4$). In some examples, the high-order silicon-containing material layer precursor may have one silicon atom per molecules, such as silane. The high-order silicon-containing material layer precursor may have two or more silicon atoms per molecules, such as disilane. In some examples, the high-order silicon-containing material layer precursors may have three or more silicon atoms. The high-order silicon-containing material layer precursors may include a non-halogenated high-order silicon-containing material layer precursor, such as trisilane and tetrasilane. The high-order silicon-containing material layer precursor may include a halogenated high-order silicon-containing material layer precursor, for example, a high-order chlorine-containing precursors, such as chlorodisilane, dichlorosilane, trichlorosilane, and tetrachloridesilane. The precursor gases may include a high-order germanium-containing material layer precursor, such as germane, digermane, trigermane, their chloride derivatives and mixtures thereof. The precursor gases may include a P-dopant high order precursor such as diborane ($B_2H_6$). The precursor gases may also include an N-dopant high order precursor such as phosphine ($PH_3$) and arsine ($AsH_3$).

In a conventional system, a relatively high temperature or an electrical field may need to be applied in the processing chamber to activate the precursor gases. Such high temperature may damage chamber components and/or exceed the thermal budget of certain semiconductor devices. Even the conventional system may use plasma enhanced technologies and high-order precursors, these high-order precursors may still need a more complicated process to decompose in the processing chamber. As such, the control of the decomposition and the chemical reaction in the conventional processing chamber may be difficult, thereby negatively impacting the growth rate and the quality of the epitaxial films in the conventional system.

In contrast with the conventional system, the use of exemplary material layer deposition methods and semiconductor processing systems as described herein may decompose a high-order precursor, such as a high-order silicon-containing material layer precursor, in a remote plasma unit before the precursor gases flow into a processing chamber. The decomposed molecules are more reactive and more likely to participate in the chemical reactions in the processing chamber. A larger number of decomposed silicon-containing molecules from high-order precursors may also enable greater material layer deposition rates, which may promote greater growth rate at relatively lower temperature regime. The exemplary material layer deposition methods and semiconductor processing systems as described herein may intermix decomposed silicon-containing molecules from silane with a higher-order silicon-containing material layer precursor (e.g., disilane), which may enable throttling the deposition process without throttling power applied to the remote plasma unit, thus improving control of the deposition process. For example, throttling the deposition process may be implemented via a mass flow controller (MFC) that controls a ratio of the silane and disilane in the mixture flowing into the processing chamber. In another example, throttling the deposition may be implemented via a tuning of the plasma generating power in the remote plasma unit. A higher plasma generating power may promote the decomposition process in the remote plasma unit, which in turn may increase the deposition rate in the processing chamber.

In the following description of the various embodiments, reference is made to the accompanying drawings, which form a part hereof, and in which is shown by way of illustration various embodiments in which aspects of the disclosure may be practiced. It is to be understood that other embodiments may be utilized and structural and functional modifications may be made without departing from the scope of the present disclosure. Aspects of the disclosure are capable of other embodiments and of being practiced or being carried out in various ways. Also, it is to be understood that the phraseology and terminology used herein are for the purpose of description and should not be regarded as limiting. Rather, the phrases and terms used herein are to be given their broadest interpretation and meaning. The use of "including" and "comprising" and variations thereof is meant to encompass the items listed thereafter and equivalents thereof as well as additional items and equivalents thereof. While various directional arrows are shown in the figures of this disclosure, the directional arrows are not intended to be limiting to the extent that bi-directional communications are excluded. Rather, the directional arrows are to show a general flow of steps and not the unidirectional movement of information. In the entire specification, when an element is referred to as "comprising" or "including" another element, the element should not be understood as excluding other elements so long as there is no special conflicting description, and the element may include at least one other element. Throughout the specification, expressions such as "at least one of a, b, and c" may include "a only," "b only," "c only," "a and b," "a and c," "b and c," and/or "all of a, b, and c."

FIG. 1 illustrates a semiconductor processing system 10. The semiconductor processing system 10 may include a precursor delivery arrangement 12, a remote plasma unit 13, a chamber arrangement 100, and an exhaust arrangement 14. The precursor delivery arrangement 12 may be connected to the remote plasma unit 13, and may be configured to provide a precursor (e.g., a silicon-containing material layer precursor) to the remote plasma unit 13. The remote plasma unit 13 may decompose at least a portion of the silicon-containing material layer precursor to generate the decomposition product. The remote plasma unit 13 may be connected to the chamber arrangement 100, and be configured to provide the decomposition product generated from the silicon-containing material layer precursor to the chamber arrangement 100. The chamber arrangement 100 may be connected to the exhaust arrangement 14 and may be configured to deposit a material layer 4 onto a substrate 2 supported within the chamber arrangement 100 using the decomposition product generated from the silicon-containing material layer precursor. The exhaust arrangement 14 is in fluid communication with the environment 18 external to the semiconductor processing system 10 and is configured to communicate a flow of residual precursor (e.g., the un-decomposed silicon-containing material layer precursor) and/or reaction products to the environment 18.

The remote plasma unit 13 may connect with a precursor inlet that is coupled to the chamber arrangement 100. The remote plasma unit 13 may be configured to decompose at least a portion of a silicon-containing material layer precursor provided to the remote plasma unit 13. The remote plasma unit 13 may decompose between about 0.001% and about 90% of the silicon-containing material layer precursor provided to the remote plasma unit 13. For example, between about 0.001% and about 10%, or between about 10% and about 20%, or between about 20% and about 50%, or between about 50% and about 70%, or between about 70% and about 90% of the silicon-containing material layer precursor may be decomposed by the remote plasma unit 13 prior to admission to the chamber arrangement 100. During deposition, an epitaxial material layer comprising silicon may be deposited onto the substrate using a decomposition product generated from the silicon-containing material layer precursor.

In some examples, the remote plasma unit 13 may include an inductively-coupled plasma unit (shown in FIG. 1). The inductively coupled plasma unit may include a precursor conduit connected to the precursor inlet, a coil extending about the precursor conduit, and a voltage source electrically connected to the coil and configured to flow a decomposition current through the coil. The coil may be spaced apart from the chamber arrangement 100, for example to prevent the remote plasma unit 13 from disrupting the heater element array in the chamber arrangement 100, and to ensure that the plasma enters the chamber arrangement 100 through the injection flange. In some examples, the remote plasma unit 13 may include a microwave plasma unit (not shown in FIG. 1). The microwave plasma unit may include a precursor conduit connected to the precursor inlet, and a microwave source configured to generate a microwave to decompose at least a portion of the silicon-containing material layer precursor provided to the remote plasma unit 13.

Figure 2:
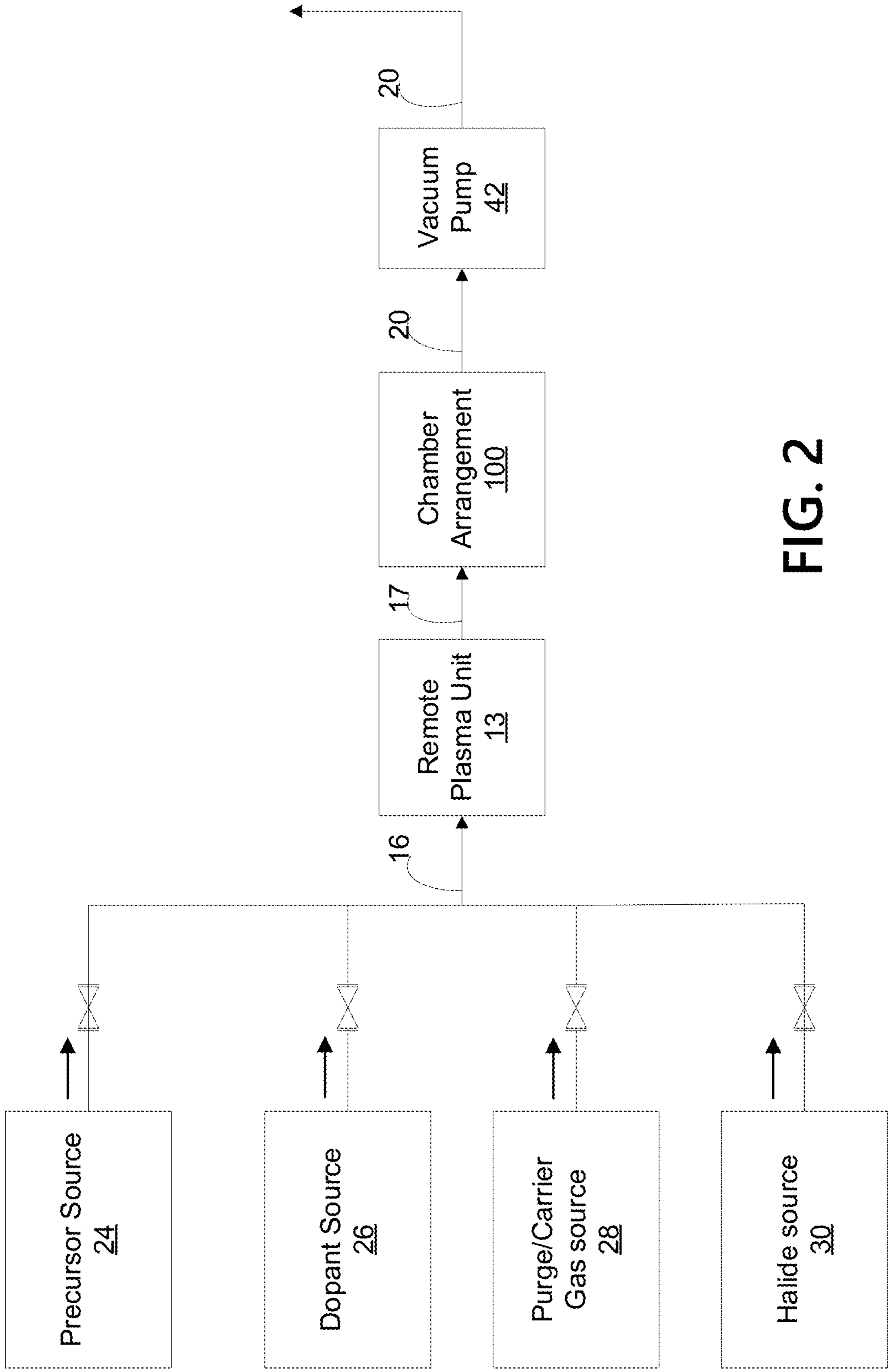
FIG. 2 is a schematic view of the semiconductor processing system of FIG. 1 according to an example of the present disclosure, showing the remote plasma unit providing decomposed high-order precursor to the chamber arrangement.

FIG. 2 is a schematic view of the semiconductor processing system of FIG. 1 according to an example of the present disclosure, showing the precursor delivery arrangement providing a precursor to the remote plasma unit and the chamber arrangement, and the exhaust arrangement receiving a flow of residual precursor and/or reaction products issued by the chamber arrangement. The precursor delivery arrangement 12 may deliver a precursor 16 (e.g., a silicon-containing material layer precursor) to the remote plasma unit 13, which may be coupled with various gas sources 24-30. The remote plasma unit 13 may decompose at least a portion of the precursor 16 to generate a mixed precursor 17, which flows into the chamber arrangement 100, which may in turn connect to a vacuum pump 42 of the exhaust arrangement 14. The gas sources 24-30 may include a precursor source 24, a dopant source 26, a purge/carrier gas source 28 and a halide source 30.

The precursor source 24 may be a structure that provides a flow of a precursor (not shown in FIG. 2), which includes one or more silicon-containing precursor. The flow of the precursor to the remote plasma unit 13 may be controlled by mass flow controllers (MFCs). The precursor may include a silicon-containing material layer precursor having one silicon atom per molecule such as silane ($SiH_4$) or monochlorosilane ($ClH_3Si$). Alternatively (or additionally), the precursor may include a high-order silicon precursor such as a silicon-containing material layer precursor having two or more silicon atoms per molecule, or three or more silicon atoms in certain examples. The high-order silicon-containing material layer precursors may include a non-halogenated high-order silicon-containing material layer precursor, such as trisilane and tetrasilane. The high-order silicon-containing material layer precursor may include a halogenated high-order silicon-containing material layer precursor, for example, a high-order chlorine-containing precursors, such as chlorodisilane, dichlorosilane, trichlorosilane, and tetrachloridesilane.

The precursor may include a germanium-containing precursor, and is configured to provide a flow of the germanium-containing precursor to the remote plasma unit 13 through the MFCs. Examples of suitable germanium-containing precursors include germane ($GeH_4$). The precursor may include a high-order germanium-containing material layer precursor, such as germane, digermane, trigermane, their chloride derivatives and mixtures thereof. The remote plasma unit 13 may decompose at least a portion of the high-order precursor to generate the decomposition product. After decomposition, a mixture of the high-order precursor and the decomposition product (e.g., the mixed precursor 17) may flow into the chamber arrangement 100 from the remote plasma unit 13.

The dopant source 26 may be a structure that provides a flow of a dopant (not shown in FIG. 2) to the remote plasma unit 13. The dopant source 26 may be similarly connected to the remote plasma unit 13 via the MFCs, and may deliver a dopant-containing precursor. The dopant source 26 may be further configured to provide a flow of the dopant-containing precursor to the chamber arrangement 100 via the remote plasma unit 13. In certain examples, the dopant-containing precursor may include phosphorous (P). It is also contemplated that the dopant-containing precursor may include boron (B) and/or arsenic (As) and remain within the scope of the present disclosure. In some examples, the dopant-containing precursor may include a P-dopant high-order precursor such as diborane ($B_2H_6$). The dopant-containing precursor may include an N-dopant high-order precursor such as phosphine ($PH_3$) and arsine ($AsH_3$). The remote plasma unit 13 may decompose at least a portion of the high-order dopant precursor to generate decomposed dopant precursor. A mixture of the high-order dopant precursor and the decomposed dopant precursor may flow into the chamber arrangement 100 from the remote plasma unit 13.

The purge/carrier gas source 28 may be a structure that provides a flow of purge/carrier gas (not shown in FIG. 2) to the remote plasma unit 13, and may be additionally configured to provide a flow of the purge/carrier gas to the chamber arrangement 100. The purge/carrier gas may be configured to carry a gas (e.g., one or more precursor such as the high-order silicon precursors, the decomposed silicon precursors, and/or the dopant into the chamber arrangement 100. Examples of suitable purge/carrier gases may include hydrogen ($H_2$) gas, nitrogen ($N_2$) gas, inert gases such as argon (Ar) gas or helium (He) gas, and mixtures thereof.

The halide source 30 may be a structure that provides a halide-containing material (not shown in FIG. 2), and is configured to provide a flow of the halide-containing material 30 to the chamber arrangement 100 via the remote plasma unit 13. The halide-containing material may be co-flowed with the precursor 16 into the remote plasma unit 13. The halide-containing material may be flowed independently from the precursor 16, such as to provide a purge and/or to remove condensate from within the remote plasma unit 13 or the chamber arrangement 100. The halide-containing material may be co-flowed with the purge/carrier gas. Examples of suitable halides include chlorine (Cl), e.g., chlorine ($Cl_2$) gas and hydrochloric (HCl) acid, as well as fluorine (F), e.g., fluorine ($F_2$) gas and hydrofluoric (HF) acid.

The exhaust arrangement 14 may be configured to evacuate the chamber arrangement 100 and may include one or more vacuum pumps 42 and/or an abatement apparatus (not shown in FIG. 2). The one or more vacuum pumps 42 may be connected to the chamber arrangement 100 and configured to control pressure within the chamber arrangement 100. The abatement apparatus may be connected to the one or more vacuum pumps 42 and configured to process the flow of residual precursor and/or reaction products 20 issued by the chamber arrangement 100. The exhaust arrangement 14 may be configured to maintain environmental conditions within the chamber arrangement 100 suitable for atmospheric deposition operations, such as pressures between about 600 torr and about 760 torr, such as during the deposition of epitaxial material layers including silicon during atmospheric pressure techniques. The exhaust arrangement 14 may also be configured to maintain environmental conditions within the exhaust chamber arrangement 14 suitable for reduced pressure deposition operations, such as pressures between about 0.01 torr and about 600 torr, such as during the deposition of epitaxial material layers including using reduced pressure techniques.

Figure 3:
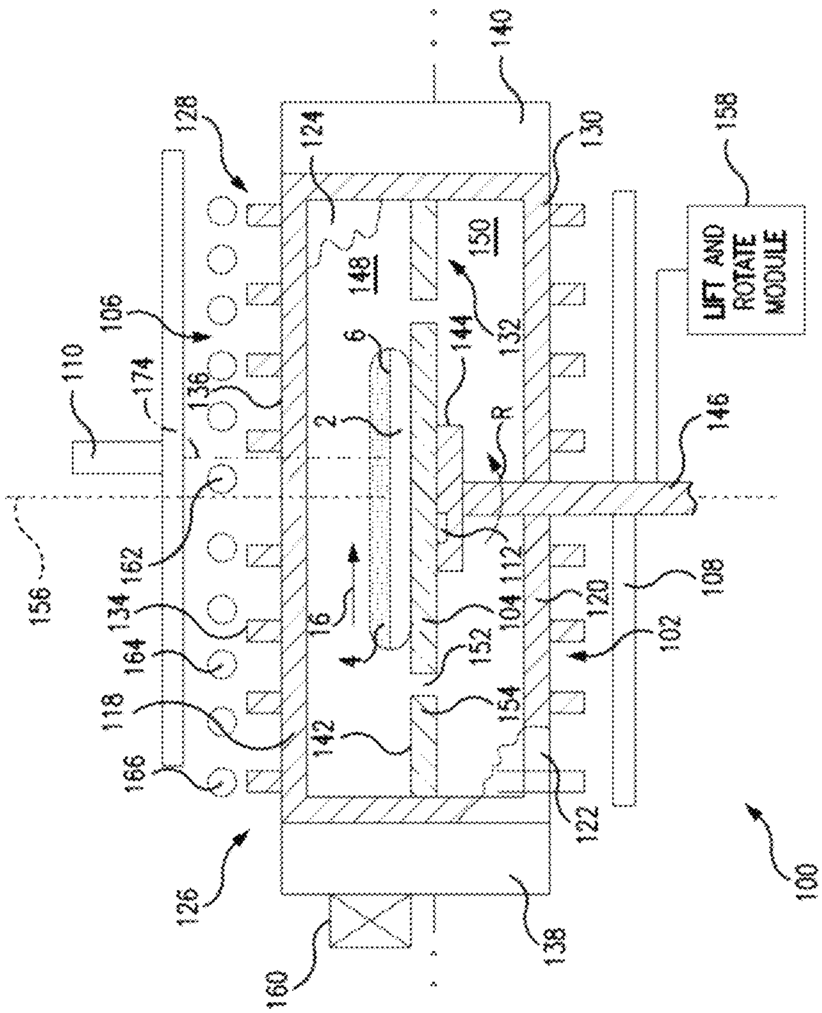
FIG. 3 is schematic side view of the chamber arrangement of FIG. 1 according to the present disclosure.

FIG. 3 is a schematic side view of the chamber arrangement 100. By way of example, the chamber arrangement 100 may include a cross flow, cold wall epitaxial reaction chamber. The chamber arrangement 100 may include a chamber body 102 and a substrate support 104. The chamber arrangement 100 may also include an upper heater element array 106 and a lower heater element array 108. Although a specific arrangement is shown and described herein, it is to be understood and appreciated that the chamber arrangement 100 may include other elements and/or omit elements shown and described herein and remain within the scope of the present disclosure.

The chamber body 102 may be configured to flow the precursor 16 across the substrate 2 and may have an upper wall 118, a lower wall 120, a first sidewall 122, and a second sidewall 124. The upper wall 118 extends longitudinally between an injection end 126 and a longitudinally opposite exhaust end 128 of the chamber body 102. In certain examples, the chamber body 102 may be formed from a ceramic material such as sapphire or quartz. The chamber body 102 may include a plurality of external ribs 134. The plurality of external ribs 134 may extend laterally about an exterior 136 of the chamber body 102 and be longitudinally spaced between the injection end 126 and the exhaust end 128 of the chamber body 102. It is also contemplated that, in accordance with certain examples, the chamber body 102 may include no ribs.

An injection flange 138 and an exhaust flange 140 may be connected to the injection end 126 and the exhaust end 128, respectively, of the chamber body 102. The injection flange 138 may fluidly couple the remote plasma unit 13 (shown in FIG. 1) to the interior 132 of the chamber body 102 and be configured to provide the precursor 16 to the interior 132 of the chamber body 102. The exhaust flange 140 may fluidly couple the interior 132 of the chamber body 102 to the exhaust arrangement 14. The exhaust flange 140 may be configured to communicate the residual precursor and/or reaction products 20 issued by the chamber arrangement 100 during deposition of the material layer 4 onto the substrate 2. The chamber body 102 may have a cold wall, cross-flow reactor configuration.

A support member 144, and a shaft member 146 may be arranged within the chamber body 102. The substrate 2 may be configured to seat on substrate support 104 and to be supported for rotation about a rotation axis 156 within the interior of the chamber body. The support member 144 may be fixed in rotation relative to the substrate support 104 about the rotation axis 156 for rotation with the substrate support 104. The substrate support 104 may be formed from an opaque material, such as silicon carbide or a bulk graphite material.

The upper heater element array 106 may be configured to heat the substrate 2 and/or the material layer 4 during deposition onto the substrate 2 by radiantly communicating heat into the upper chamber 148 of the chamber body 102. The upper heater element array 106 may include a plurality of upper linear lamps supported above the chamber body 102 and optically coupled to the substrate support 104 by the quartz material forming the chamber body. The lower heater element array 108 may be similar to the upper heater element array 106 and may also be configured to heat the substrate 2 and/or the material layer 4 during deposition onto the substrate 2. The lower heater element array 108 may include a plurality of lower linear lamps supported below the chamber body 102 and optically coupled to the substrate support 104 by the quartz material forming the chamber body 102.

In certain examples the precursor source 24 may include a first silicon-containing material layer precursor having one silicon atom per molecule, such as silane ($SiH_4$), and a second silicon-containing material layer precursor having two or more silicon atoms per molecule, such as dichlorosilane. In such examples the remote plasma unit 13 may receive only one of the first silicon-containing material layer precursor and the second silicon-containing material layer precursor, the remote plasma unit 13 in turn communicating radicals generated from only one of the first silicon-containing material layer precursor and the second silicon-containing material layer precursor. For example, the first silicon-containing material layer precursor may bypass the remote plasma unit 13, and the second silicon-containing material layer precursor may flow to the chamber arrangement 100 through the remote plasma unit 13. The first silicon-containing material layer precursor and the second material layer precursor may be co-flowed with one another to the chamber arrangement 100, the reactor receiving radicals generated from the second silicon-containing material layer precursor co-flowed with the first silicon-containing material layer precursor.

In certain examples the remote plasma unit 13 may be one of a plurality of remote plasma units coupling a gas manifold header, and the precursor source 24 therethrough, to the chamber arrangement 100 via intermediate MFCs. In such examples each of the plurality of remote plasma units may couple the gas manifold header through a singular MFC to the chamber arrangement 100 to provide tunability to flow of radicals into the chamber arrangement. Examples of suitable gas manifold headers and MFC arrangements include those shown and described in U.S. Pat. No. 11,053,591 to Ma et al, issued on Jul. 6, 2021, the contents of which are incorporated herein by reference in its entirety.

Figure 4A:
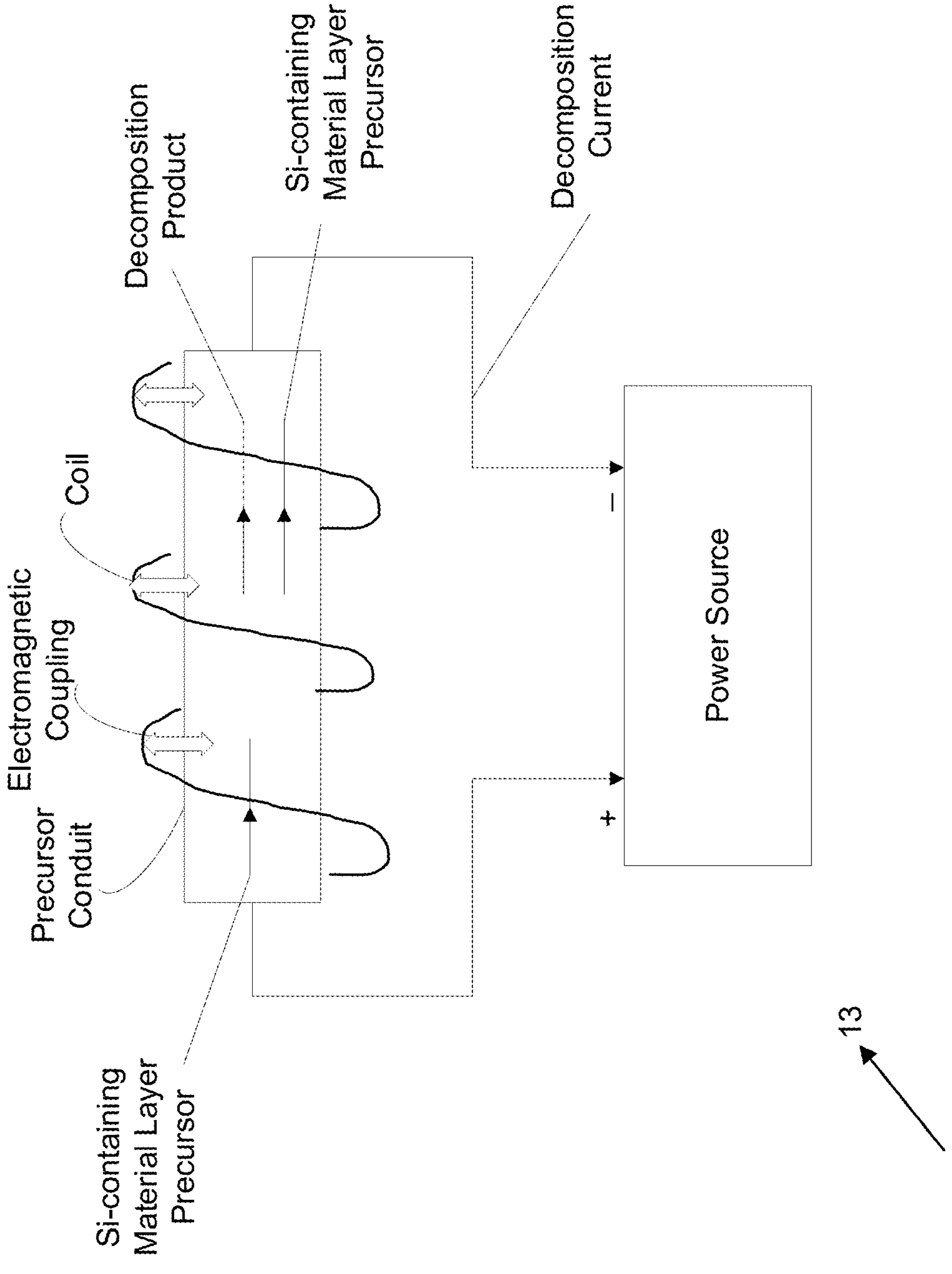
FIG. 4A shows an example inductively-coupled plasma unit according to the present disclosure.

FIG. 4A shows an example inductively-coupled plasma unit according to the present disclosure. The remote plasma unit 13 may include an inductively-coupled plasma unit. As shown in FIG. 4A, electric currents produced by electromagnetic induction, such as time-varying magnetic fields generated by electromagnetic coupling may be applied in inductively-coupled plasma unit. The inductively-coupled plasma unit may include a precursor conduit connected to a precursor inlet. The inductively-coupled plasma unit may include a coil extending about the precursor conduit, and a voltage source electrically connected to the coil and configured to flow a decomposition current through the coil. In some examples, the coil may be spaced apart from the chamber body to prevent the remote plasma unit from disrupting the heater element array in the chamber body and to ensure that the plasma enters the chamber body through the injection flange. The inductively-coupled plasma unit may operate at a wide range of gas pressure and frequencies.

In some examples, the magnetic fields may induce an electric current (e.g., the decomposition current) within the high-order precursor gas to decompose at least a portion of the high-order precursor and to generate the plasma. The plasma may be a mixture of the undecomposed high-order precursor and decomposition product (e.g., silicon-containing radicals) generated from the high-order precursor. The plasma may be provided to the chamber arrangement 100. For example, the inductively-coupled plasma unit may decompose a silicon-containing material layer precursor and may provide the plasma through the injection flange, which fluidly couples the inductively-coupled plasma unit to the interior of the chamber body. The inductively-coupled plasma unit may also include a precursor conduit connected to the precursor inlet (not shown in FIG. 4A), and the gas sources (e.g., the precursor source) may provide the high-order precursor through the precursor inlet. During deposition, an epitaxial material layer comprising silicon may be deposited onto the substrate using the decomposition product generated from the silicon-containing material layer precursor.

In some examples, the inductively-coupled plasma unit may not fully decompose the silicon-containing material layer precursor including a high-order precursor. However, this mixture of un-decomposed high-order precursor and the decomposition product may not impact the growth rate of the wafer in the processing chamber. Due to the high reactivity of the decomposition product, for example, a 10% decomposition rate of the high-order precursor in the inductively-coupled plasma unit may be adequate to achieve a stable growth rate in the processing chamber. In a conventional plasma-enhanced system, to use a high-order precursory in the processing chamber, a relatively higher temperature (e.g., 600-700° C.) and energy level may need to be applied to the processing chamber to decompose the high-order precursor. Here, after the high-order precursor is partially decomposed in the inductively-coupled plasma unit and the decomposition product flows into the chamber body, the decomposition product may react with the substrate at a relatively lower temperature (e.g., 400-450° C.) in the processing chamber. As such, the exemplary material layer deposition methods and semiconductor processing systems as described herein may achieve a stable wafer growth rate with a relatively lower temperature regime.

Figure 4B:
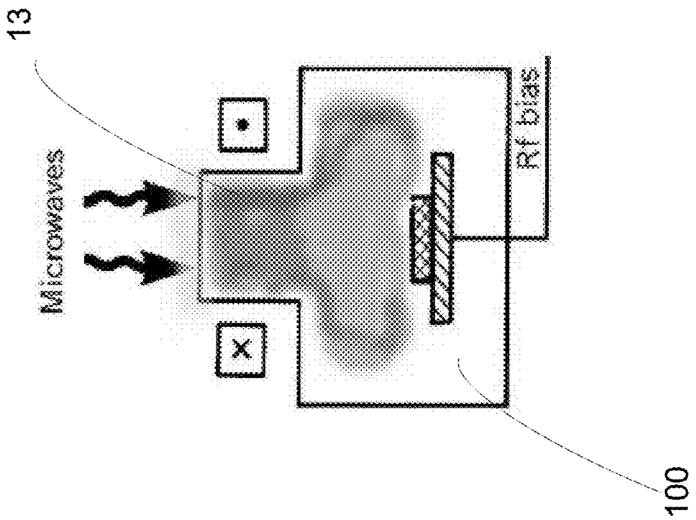
FIG. 4B shows an example microwave plasma unit according to the present disclosure.

FIG. 4B shows an example microwave plasma unit according to the present disclosure. The remote plasma unit 13 may include a microwave plasma unit. As shown in FIG. 4B, microwaves may be applied in the microwave plasma unit and the plasma may be ignited and sustained. The microwave plasma unit may include a precursor conduit connected to the chamber arrangement 100 via a precursor inlet. The microwave plasma unit may include a microwave source to create a high electromagnetic field concentration in the middle of the microwave cavity.

In some examples, the microwave plasma unit may receive and decompose at least a portion of the high-order precursor and generate the plasma. The plasma may be a mixture of the undecomposed high-order precursor and decomposition product generated from the high-order precursor. The plasma may be provided to the chamber arrangement 100. For example, the microwave remote plasma unit may decompose a silicon-containing material layer precursor provided to the microwave plasma unit.

Figure 5:
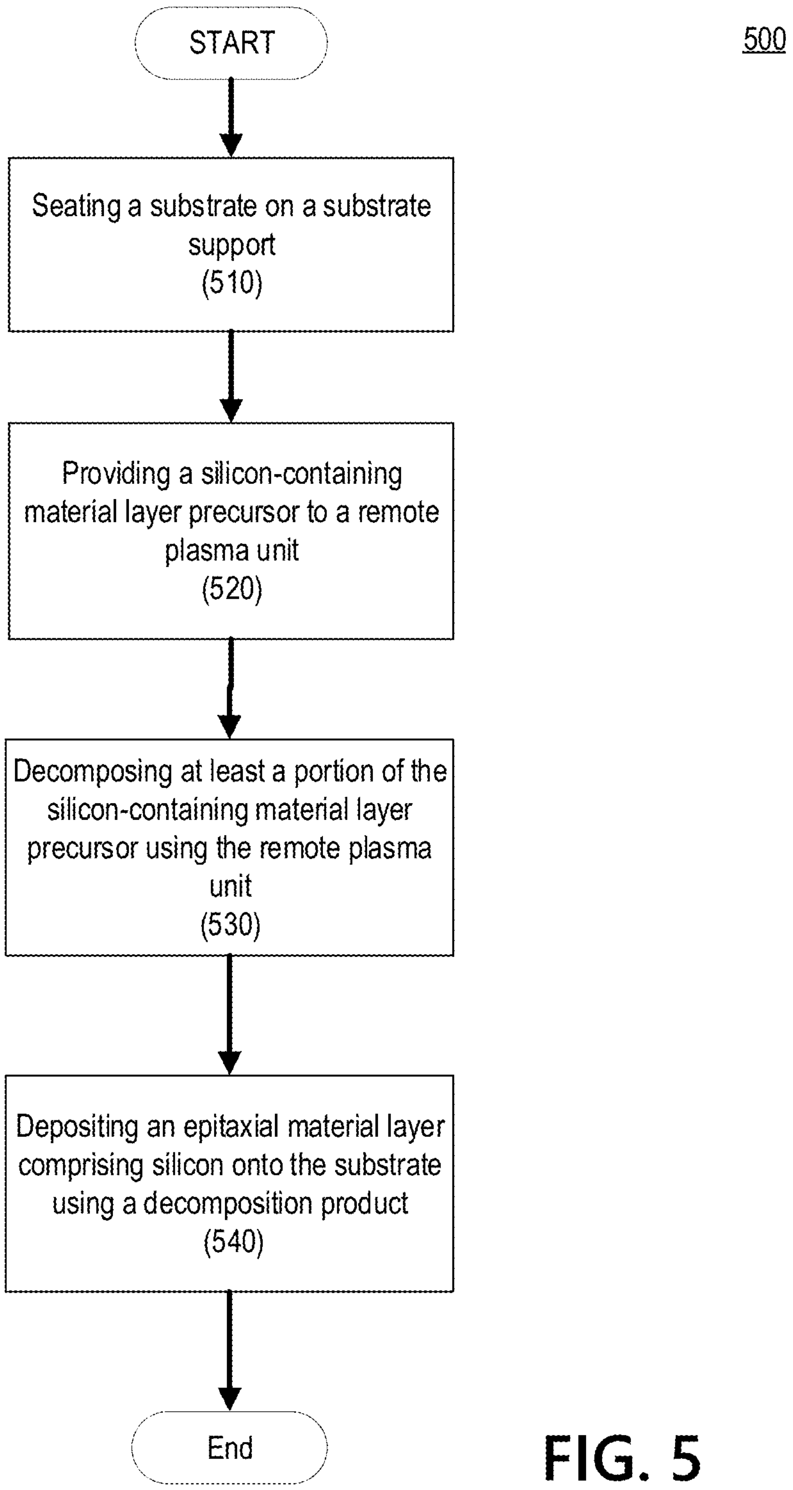
FIG. 5 shows an example flowchart describing a process for a material layer deposition method according to one or more aspects of the disclosure.

FIG. 5 shows an example flowchart describing a process for a material layer deposition method using a semiconductor processing system according to one or more aspects of the disclosure. At step 510, a controller in the semiconductor processing system may seat the substrate on the substrate support. The semiconductor processing system may include a remote plasma unit and a chamber body formed from a ceramic material such as sapphire or quartz. The chamber body may have an injection end and a longitudinally opposite exhaust end. An injection flange may be connected to the injection end of the chamber body and may couple the remote plasma unit to the chamber body. An exhaust flange may be connected to the longitudinally opposite exhaust end of the chamber body and may be fluidly coupled to the remote plasma unit by the interior of the chamber body and the injection flange. A vacuum pump may be coupled to the chamber body and therethrough to the remote plasma unit. The chamber body may have a plurality of external ribs extending laterally about an exterior of the chamber body and the external ribs may be longitudinally spaced apart from one another between the injection end and the longitudinally opposite exhaust end of the chamber body.

The semiconductor processing system may include a support member arranged within the chamber body. The substrate may be configured to be seated on the substrate support and to rotate about a rotation axis within the chamber body. The substrate support may be formed from a bulk graphite material with a silicon carbide coating. The semiconductor processing system may include a heater element array supported outside of the chamber body and optically coupled to the substrate support by the quartz material. The heater element array may include a plurality of lower linear lamps supported below the chamber body and optically coupled to the substrate support by the quartz material forming the chamber body. The heater element may include a plurality of upper linear lamps supported above the chamber body and optically coupled to the substrate support by the quartz material forming the chamber body. In some examples, one and only one substrate may be seated within the chamber body. In other examples, more than one substrate may be seated within the chamber body.

Figure 7:
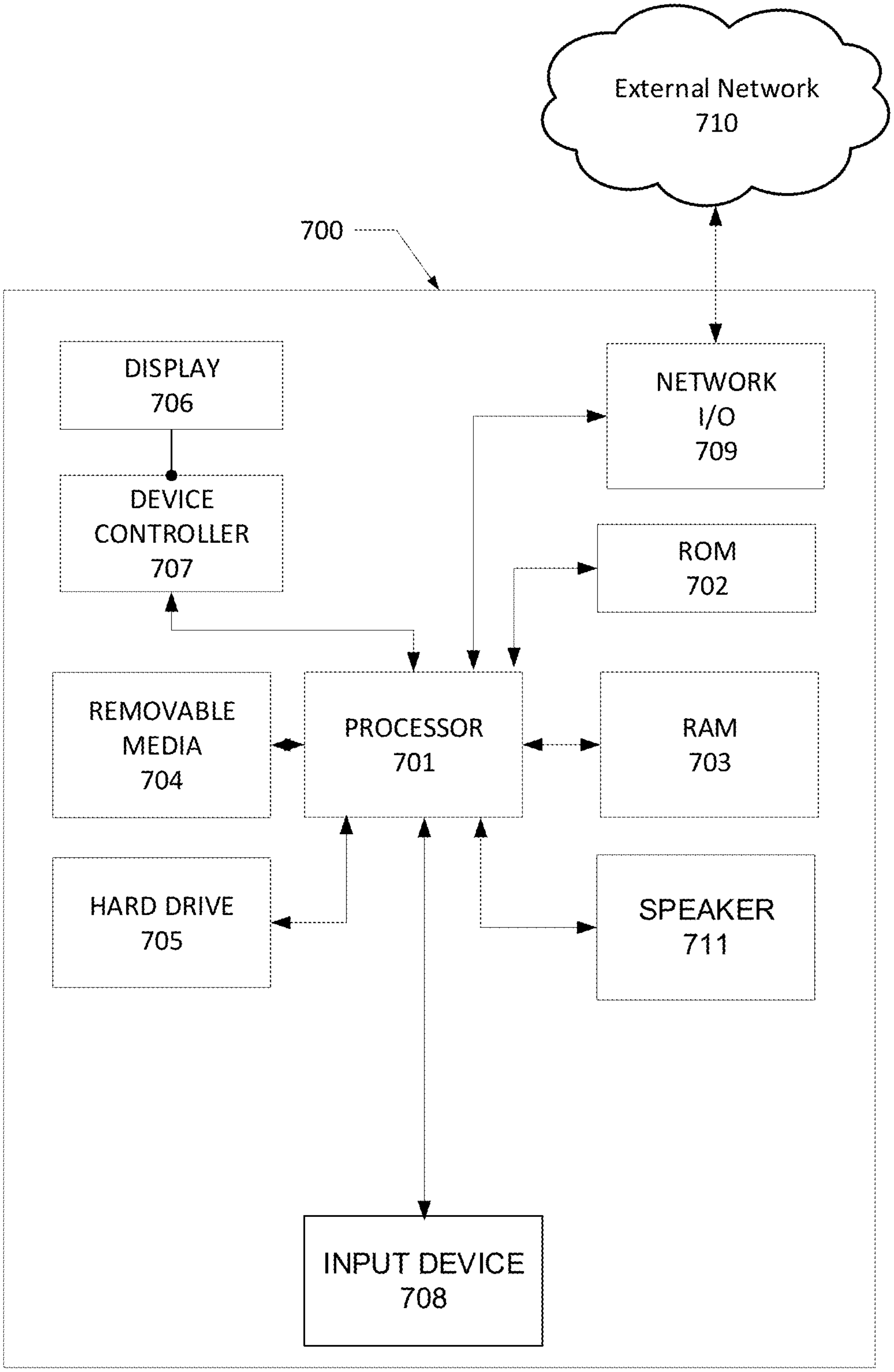
FIG. 7 depicts an example of a computing device that may be used in implementing one or more aspects of the disclosure.

The semiconductor processing system may include a controller (e.g., as illustrated in FIG. 7) communicatively coupled with various other components of the semiconductor processing system and may be configured to control their operations. For example, the controller may control the remote plasma unit, such as by controlling one or more of plasma power and ignition. The controller may control the seating of the substrate on the, heating of the substrate, and/or flow of the precursor the remote plasma unit.

At step 520, the silicon-containing material layer precursor may be provided to the remote plasma unit. For example, the controller may control a precursor source or precursor gas(es) to provide the silicon-containing material layer precursor to the remote plasma unit. The remote plasma unit may include an inductively-coupled remote plasma unit or a microwave remote plasma unit. The inductively-coupled remote plasma unit may include a precursor inlet and a precursor conduit connected to the precursor inlet. The silicon-containing material layer precursor may flow from the precursor source to the remote plasma unit via the precursor inlet. The inductively-coupled remote plasma unit may further include a coil extending about the precursor conduit, and a voltage source electrically connected to the coil and configured to flow a decomposition current through the coil. The coil may be spaced apart from the chamber body to prevent disruption to the heater element array in the chamber body and damaging the quartz body.

In some examples, the precursor gases may include a silicon containing material layer precursor having one silicon atom per molecule such as silane ($SiH_4$). The precursor gases may include a high-order silicon precursor having two or more silicon atoms per molecule, or three or more silicon atoms in certain examples. The high-order silicon-containing material layer precursors may include a non-halogenated high-order silicon-containing material layer precursor, such as trisilane and tetrasilane. The high-order silicon-containing material layer precursor may include a halogenated high-order silicon-containing material layer precursor, such as chlorodisilane, dichlorosilane, trichlorosilane, and tetrachloridesilane. The precursor gases may include a high-order germanium-containing material layer precursor, such as germane, digermane, trigermane, their chloride derivatives and mixtures thereof.

In some examples, the precursor gases may include a dopant-containing precursor. The dopant-containing precursor may include phosphorous (P), boron (B) and/or arsenic (As). In some examples, the dopant-containing precursor may include a P-dopant high-order precursor such as diborane ($B_2H_6$). The dopant-containing precursor may include an N-dopant high-order precursor such as phosphine ($PH_3$) and arsine ($AsH_3$).

At step 530, at least a portion of the silicon-containing material layer precursor may be decomposed using the remote plasma unit. The remote plasma unit may decompose at least a portion of the high-order silicon precursor to generate the decomposition product. For example, any amount between about 0.001% and about 90% of the silicon-containing material layer precursor provided to the remote plasma source may be decomposed.

As the silicon-containing material layer precursor flows through the conductive coil of the remote plasma unit, a plasma may be generated by breaking the precursor molecules into different forms, such as a form with free radicals. A decomposition product carrying free radicals may be more active and more likely to participate in the chemical reactions on the surface of the wafer. The un-decomposed form of the precursor may be less active and less likely to participate in the chemical reactions on the surface of the wafer. For example, a silicon-containing material layer precursor $SiH_4$ may be partially decomposed to a mixture of SiHx(−) and $SiH_4$. The mixture of the silicon-containing material layer precursor (e.g., $SiH_4$) and the decomposition product (e.g., SiHx(−) or other silicon-containing radical) may flow into the chamber body.

In some examples, a purge/carrier gas source may be provided to the remote plasma unit to carry one or more of the high-order silicon precursors, the decomposition product, and/or the dopant source to flow into the chamber body. Examples of purge/carrier gases may include hydrogen ($H_2$) gas, nitrogen ($N_2$) gas, inert gases such as argon (Ar) gas or helium (He) gas, and mixtures thereof.

In some examples, the controller may be communicatively coupled with the remote plasma unit to control the decomposition of the silicon-containing material layer precursor. For example, the controller may tune the frequency of an RF signal applied to the remote plasma unit to induce the generation of the plasma. The controller may determine a frequency range that may promote the decomposition of the silicon-containing material layer precursor and in turn, the wafer growth rate in the chamber body. The controller may tune the plasma generating temperature applied to the remote plasma unit to induce the generation of the plasma. The controller may determine a temperature range that may promote the decomposition of the silicon-containing material layer precursor and in turn, the wafer growth rate in the chamber body. Note that the plasma generating temperature may still be relatively lower than the temperature applied to the processing chamber in the conventional system to decompose the precursor in the chamber body. As a result, the temperature regime in the present disclosure is lower than that in the conventional system. The controller may tune a plasma generating power applied to the remote plasma unit to induce the generation of the plasma. The controller may determine a power range (e.g., 5-400 watts) that may promote the decomposition of the silicon-containing material layer precursor and in turn, the wafer growth rate in the chamber body. In contrast, the conventional plasma enchanted system may need a power range between 400-2000 watts applied in the processing chamber, which is a much higher energy level than the plasma generating power of the systems in the present disclosure. Given that the whole un-decomposed molecules are introduced into the processing chamber, the conventional system may need more activation energy to decompose the whole molecules in the chamber and cause the deposition process to occur. Also, the present system may generate and decompose the plasma outside the chamber with a relatively lower temperature regime before it flows into the chamber. The higher temperature regime in the conventional system may damage the chamber components and/or exceed the thermal budget of certain semiconductor devices.

At step 540, the epitaxial material layer comprising the silicon may be deposited onto the substrate using the decomposition product generated from the silicon-containing material layer precursor. Depositing the epitaxial material layer may comprise rotating the substrate about the rotation axis and flowing the decomposition product longitudinally through the chamber body and across the substrate. The controller may be communicatively coupled with the chamber body to control the deposition process. The decomposition product may flow from the remote plasma unit to the chamber body via the precursor inlet. During deposition, an epitaxial material layer comprising silicon may be deposited onto the substrate using the decomposition product generated from the silicon-containing material layer precursor. The heating of the substrate during deposition of the silicon-containing material layer precursor by the heater element array may be limited by the decomposition product. Given that the decomposition product may be more reactive and more likely to participate in the chemical reaction on the surface of the substrate, a lower temperature regime may be applied to the chamber body to achieve an optimal growth rate. The non-decomposed high-order precursor may be less reactive and less likely to participate in the chemical reaction on the surface of the substrate. Such un-decomposed precursor may be expelled through the exhaust system. Under this lower temperature regime, the inherent physical or electrical properties of the deposited film may be improved. For example, in a N-doped SiP or SiAs transistor, it may be desirable for the electron to flow through the P to the N channels with a low resistance. The low resistance may be made possible under this low temperature regime, as high temperature would generally increase resistance of the transistor.

Figure 6:
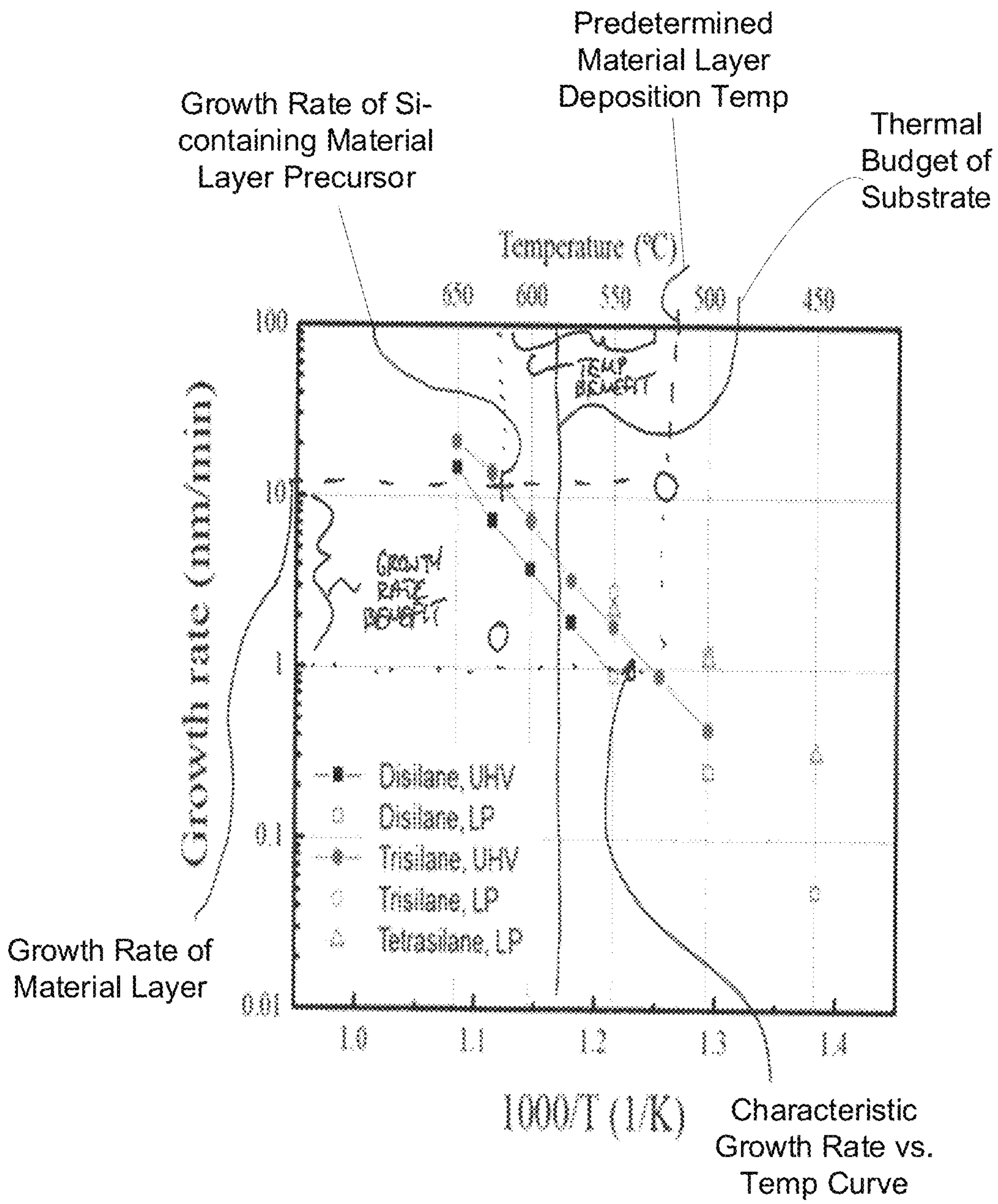
FIG. 6 shows an example characteristic growth rate versus temperature curve, according to one or more aspects of the disclosure.

In some examples, the silicon-containing material layer precursor may have a characteristic growth rate versus temperature curve (e.g., an Arrhenius curve) as shown in FIG. 6. In the example growth rate versus temperature curve of FIG. 6, the predetermined material layer deposition temperature is about 520° C. The substrate may be heated to a predetermined material layer deposition temperature (e.g., 520° C.) using the heater element array. The epitaxial material layer may be deposited at a growth rate (e.g., 10 nm/min) that is greater than a characteristic growth rate (e.g., 1 nm/min) associated with the predetermined material layer deposition temperature on the characteristic growth rate versus temperature curve. In this example, the thermal budget of the substrate is about 580° C., and the predetermined material layer deposition temperature is about 520° C. As such, the predetermined material layer deposition temperature (e.g., 520° C.) is less than the thermal budget of the substrate (e.g., 580° C.), and the epitaxial material layer deposited at the growth rate (e.g., 10 nm/min) that is associated with a deposition temperature (e.g., 625° C.) is greater than the thermal budget on the characteristic growth rate versus temperature curve.

The example method and system as described herein may achieve an optimal growth rate, higher throughput, improved film quality, and save energy consumption during the semiconductor manufacturing process. The method and system as described in the present disclosure may achieve more complicated film structure and/or deposit more layers on the substrate, where each layer may need a different temperature regime. By application of an overall lower temperature regime, the present system may have a greater degree of freedom to control the deposition process.

FIG. 7 depicts an example of a computing device that may be used in implementing one or more aspects of the disclosure. The computing device may be a device for controlling the systems (e.g., 100, 200, 300) and performing the processes (e.g., 500) described herein. For example, one or more devices and components as described herein (e.g., the controller) may be implemented with the device shown in FIG. 7.

The term "network" as used herein and depicted in the drawings refers not only to systems in which remote storage devices are coupled together via one or more communication paths, but also to stand-alone devices that may be coupled, from time to time, to such systems that have storage capability. An example system 700 may be used according to one or more illustrative aspects described herein. The system 700 may have a processor 701 for controlling overall operation of the system and its associated components, including read-only memory (ROM) 702, random access memory (RAM) 703, removable media 704, a hard drive 705, a display device 706, a device controller 707, an input device 708, a network input/output (I/O) device 709, and a speaker 711.

The input device 708 may include a mouse, keypad, touch screen, scanner, optical reader, and/or stylus (or other input device(s)) through which a user of the system 700 may provide input. One or more speakers 711 may provide audio output, and the display device 706 may provide textual, audiovisual, and/or graphical output. Software may be stored within the removable media 704 and/or the hard drive 705 to provide instructions to processor 701 for configuring the system 700 into a special purpose computing device in order to perform various functions as described herein. For example, the removable media 704 and/or the hard drive 705 may store software used by the system 700, such as an operating system, application programs, and/or an associated database.

The system 700 may operate in a networked environment supporting connections to one or more remote computers or components, such as the precursory delivery arrangement 12, the remote plasma unit 13, the chamber arrangement 100 and exhaust arrangement 14, etc. The external network 710 may include a local area network (LAN) and a wide area network (WAN), but may also include other networks. When used in a LAN networking environment, the system 700 may be connected to the LAN through the network I/O 709 (e.g., a network interface or adapter). When used in a WAN networking environment, the system 700 may include a modem or other wide area network interface for establishing communications over the WAN, such as the Internet. It will be appreciated that the network connections shown are illustrative and other means of establishing a communications link between the computers may be used. The system 700 may be a mobile terminal (e.g., a mobile phone, a smartphone, a personal digital assistant (PDA), a laptop computer, etc.) including various other components, such as a battery, speaker, and antennas (not shown).

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A semiconductor processing system, comprising:

a chamber body formed from a quartz material;

a substrate support configured to support a substrate and arranged within an interior of the chamber body and supported for rotation about a rotation axis within the interior of the chamber body, the substrate support formed from a bulk graphite material with a silicon carbide coating;

a heater element array supported outside of the chamber body and optically coupled to the substrate support by the quartz material; and a remote plasma unit with a precursor inlet coupled to the chamber body and configured to decompose a silicon-containing material layer precursor provided to the remote plasma unit during deposition of an epitaxial material layer comprising silicon onto the substrate using a decomposition product generated from the silicon-containing material layer precursor.

2. The semiconductor processing system of claim 1, further comprising a precursor source including the silicon-containing material layer precursor connected to the precursor inlet of the remote plasma unit and therethrough to the chamber body.

3. The semiconductor processing system of claim 2, wherein the silicon-containing material layer precursor comprises a high-order silicon-containing material layer precursor.

4. The semiconductor processing system of claim 3, wherein the high-order silicon-containing material layer precursor includes a non-halogenated high-order silicon-containing material layer precursor.

5. The semiconductor processing system of claim 3, wherein the high-order silicon-containing material layer precursor includes a halogenated high-order silicon-containing material layer precursor.

6. The semiconductor processing system of claim 3, wherein the silicon-containing material layer precursor further comprises silane ($SiH_4$) and one or more of monochlorosilane, dichlorosilane, and trichlorosilane.

7. The semiconductor processing system of claim 1, further comprising a vacuum pump coupled to the chamber body and therethrough to the remote plasma unit.

8. The semiconductor processing system of claim 1, wherein the chamber body has an injection end and a longitudinally opposite exhaust end, the chamber body further comprising:

an injection flange connected to the injection end of the chamber body and coupling the remote plasma unit to the chamber body; and an exhaust flange connected to the longitudinally opposite exhaust end of the chamber body and fluidly coupled to the remote plasma unit by the interior of the chamber body and the injection flange.

9. The semiconductor processing system of claim 8, wherein the chamber body has a plurality of external ribs extending laterally about an exterior of the chamber body and longitudinally spaced apart from one another between the injection end and the longitudinally opposite exhaust end of the chamber body.

10. The semiconductor processing system of claim 1, wherein the heater element array comprises:

a plurality of lower linear lamps supported below the chamber body and optically coupled to the substrate support by the quartz material forming the chamber body; and a plurality of upper linear lamps supported above the chamber body and optically coupled to the substrate support by the quartz material forming the chamber body.

11. The semiconductor processing system of claim 1, wherein the remote plasma unit comprises an inductively coupled plasma source or a microwave plasma source.

12. The semiconductor processing system of claim 1, wherein the remote plasma unit comprises:

a precursor conduit connected to the precursor inlet;

a coil extending about the precursor conduit; and a voltage source electrically connected to the coil and configured to flow a decomposition current through the coil, wherein the coil is spaced apart from the chamber body.

13. The semiconductor processing system of claim 1, further comprising a controller including a processor and memory having instructions recorded on the memory that, when read by the processor, cause the processor to:

seat the substrate on the substrate support;

provide the silicon-containing material layer precursor to the remote plasma unit;

decompose at least a portion of the silicon-containing material layer precursor using the remote plasma unit; and deposit the epitaxial material layer comprising the silicon onto the substrate using the decomposition product generated from the silicon-containing material layer precursor, whereby heating of the substrate during deposition of the silicon-containing material layer precursor by the heater element array is limited by the decomposition product generated from the silicon-containing material layer precursor.

14. The semiconductor processing system of claim 13, wherein the instructions, when read by the processor, further cause the processor to cause the remote plasma unit to decompose the at least a portion of the silicon-containing material layer precursor provided to the remote plasma unit.

15. The semiconductor processing system of claim 14, wherein the instructions, when read by the processor, further cause the processor to cause the remote plasma unit to decompose between about 0.001% and about 90% of the silicon-containing material layer precursor provided to the remote plasma unit.

16. A material layer deposition method, comprising:

at a semiconductor processing system including:

a chamber body formed from a quartz material, a substrate support formed from a bulk graphite material with a silicon carbide coating arranged within an interior of the chamber body and supported for rotation about a rotation axis within the interior of the chamber body, a heater element array supported outside of the chamber body and optically coupled to the substrate support by the quartz material of the chamber body, and a remote plasma unit coupled to the chamber body, seating a substrate on the substrate support;

providing a silicon-containing material layer precursor to the remote plasma unit;

decomposing at least a portion of the silicon-containing material layer precursor using the remote plasma unit; and depositing an epitaxial material layer comprising silicon onto the substrate using a decomposition product generated from the silicon-containing material layer precursor.

17. The material layer deposition method of claim 16, wherein depositing the epitaxial material layer including heating of the substrate during deposition of the silicon-containing material layer precursor by the heater element array is limited by the decomposition product generated from the silicon-containing material layer precursor.

18. The material layer deposition method of claim 16, wherein seating the substrate on the substrate support comprises seating one and only one substrate within the chamber body, wherein decomposing the at least a portion of silicon-containing material layer precursor comprises decomposing between about 0.001% and about 90% of the silicon-containing material layer precursor provided to the remote plasma unit, and wherein depositing the epitaxial material layer comprises rotating the substrate about the rotation axis and flowing the decomposition product longitudinally through the chamber body and across the substrate.

19. The material layer deposition method of claim 16, wherein the silicon-containing material layer precursor has a characteristic growth rate versus temperature curve, the method further comprising:

heating the substrate to a predetermined material layer deposition temperature using the heater element array; and depositing the epitaxial material layer at a growth rate that is greater than a characteristic growth rate associated with the predetermined material layer deposition temperature on the characteristic growth rate versus temperature curve.

20. The material layer deposition method of claim 19, wherein the substrate has a thermal budget, wherein the predetermined material layer deposition temperature is less than the thermal budget of the substrate, and wherein the growth rate is associated with a deposition temperature greater than the thermal budget on the characteristic growth rate versus temperature curve.

* * * * *